United States Patent
Fox et al.

(10) Patent No.: US 6,624,656 B1
(45) Date of Patent: *Sep. 23, 2003

(54) INPUT/OUTPUT CIRCUIT WITH USER PROGRAMMABLE FUNCTIONS

(75) Inventors: Brian Fox, Sunnyvale, CA (US); Andreas Papaliolios, Sunnyvale, CA (US); Steven P. Winegarden, Sunnyvale, CA (US); Edmond Y. Cheung, San Jose, CA (US)

(73) Assignee: Triscend Corporation, Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/418,416

(22) Filed: Oct. 15, 1999

(51) Int. Cl.⁷ ............................................. H03K 19/177
(52) U.S. Cl. .............................. 326/41; 326/37; 326/38; 326/82
(58) Field of Search ............................. 326/57, 58, 82, 326/83, 37–41

(56) References Cited

U.S. PATENT DOCUMENTS

| | | |
|---|---|---|
| 4,870,302 A | 9/1989 | Freeman |
| 5,140,193 A | 8/1992 | Freeman et al. |
| RE34,363 E | 8/1993 | Freeman |
| 5,331,220 A | 7/1994 | Pierce et al. |
| 5,402,014 A | 3/1995 | Ziklik et al. |
| 5,489,858 A * | 2/1996 | Pierce et al. ................... 326/56 |
| 5,504,439 A | 4/1996 | Tavana |
| 5,600,271 A * | 2/1997 | Erickson et al. ............. 327/108 |
| 6,067,615 A | 5/2000 | Upton |
| 6,150,836 A * | 11/2000 | Abbott .......................... 326/38 |
| 6,172,519 B1 * | 1/2001 | Chiang et al. ................. 326/38 |
| 6,329,845 B1 * | 12/2001 | Taki ............................ 326/102 |

* cited by examiner

Primary Examiner—Anh Tran
(74) Attorney, Agent, or Firm—Blakely, Sokoloff, Taylor & Zafman LLP

(57) ABSTRACT

The I/O circuit of the present invention provides optimal flexibility and performance using a number of different structures and methods. The present invention provides a signal follower circuit for an input pad. In one embodiment, the output buffer is capable of injecting a constant onto a pad during reconfiguration of a configurable system logic circuit. The present invention also provides a circuit for generating a programmable data propagation delay, thereby guaranteeing zero hold time for an arbitrary input register. Zero hold time is accomplished by allowing the user to optimally characterize clock delay to a given input/output circuit. The present invention also provides fast switching between input pads, thereby minimizing data propagation delay between the input pads. Additionally, the present invention reduces time spent in production product test by facilitating the testing of multiple routes with one test configuration. A circuit expanding the number of data input channels available to system routing is provided. Lastly, a plurality of identical input/output block tiles (IOBTs) is disclosed, thereby enabling each I/O circuit to provide the same signals regardless of the IOBTs location in the I/O circuit.

4 Claims, 12 Drawing Sheets

CONFIG = 0

| User Output Enable Logic 501 | Memory Cell 506 | Memory Cell 508 | I/O Pad 417 |
|---|---|---|---|
| 0 | 0 | 0 | Weak pull-up |
| 0 | 0 | 1 | Invalid State |
| 0 | 1 | 0 | No Mode Active |
| 0 | 1 | 1 | Weak pull-down |
| 1 | 0 | 0 | User Output Data Logic 502 plus weak pull-up |
| 1 | 0 | 1 | Invalid State |
| 1 | 1 | 0 | User Output Data Logic 502 |
| 1 | 1 | 1 | User Output Data Logic 502 plus weak pull-down |

FIG. 5A

CONFIG = 1

| Memory Cell 503 | Memory Cell 505 | Memory Cell 507 | I/O Pad 417 |
|---|---|---|---|
| 0 | 0 | 0 | Weak pull-up |
| 0 | 0 | 1 | Invalid State |
| 0 | 1 | 0 | No Mode Active |
| 0 | 1 | 1 | Weak pull-down |
| 1 | 0 | 0 | Invalid State |
| 1 | 0 | 1 | Invalid State |
| 1 | 1 | 0 | Strongly driven to User Output Data Logic 502 |
| 1 | 1 | 1 | Invalid State |

FIG. 5B

INPUT/OUTPUT CIRCUIT WITH USER PROGRAMMABLE FUNCTIONS

FIELD OF THE INVENTION

The present invention relates to integrated circuits, such as configurable system logic devices and configurable system-on-chip products. More specifically, the present invention relates to a method and structure to provide an input/output circuit with user programmable functions.

DISCUSSION OF RELATED ART

The input/output (I/O) circuit of a conventional integrated circuit (IC) acts as an interface between the integrated circuit and the outside world. Conventional ICs have pre-determined internal wired connections. In general, the signals passed through the I/O circuit of a conventional non-programmable IC are pre-defined and come from hardwired locations. As a result, the I/O pins of the IC have known state requirements. For example, a particular I/O pin may need to be grounded when it is not receiving a signal from an external source.

Typical circuitry within a conventional I/O circuit includes buffers (input and output) and registers (for input, output, and output enable signals). I/O circuit design attempts to optimize switching speed while minimizing switching noise. The switching speed of a signal, typically a clock signal, is the time it takes to transition from one logic state to another. The amount of switching noise produced is in part attributable to the amount of overshoot occurring in the transition of the clock signal from one logic state to another. I/O circuit register design attempts to optimize setup and hold times of the register relative to a known clock signal. The setup time of a register is the amount of time prior to a controlling clock edge during which a data signal must not change. The hold time of a register is the amount of time after a controlling clock edge during which a data signal must not change. If a data signal changes during the setup time or hold time, the signal at the output of the register is unpredictable.

A short setup time and a zero or negative hold time relative to a clock signal are very desirable. However, as the hold time relative to a clock signal becomes more negative, the setup time relative to the same clock signal becomes larger. Therefore, to conventionally optimize hold times, the delay on the data input of a register relative to a clock signal is carefully simulated to make the hold time as near zero as possible.

Programmable logic, such as Field Programmable Logic devices (FPLD) and Configurable System Logic (CSL) resident on Configurable Systems on a Chip (CSoC), provide built-in circuits that can be programmably interconnected, thus allowing a user to implement different designs "in the field" using the device. Typically, these designs are implemented by using Computer-Aided Design (CAD) "Place and Route" software. The CAD Place and Route software determines the placement of the designed circuits on the CSL and programs the memory elements that control the interconnections of the designed circuits.

Additional requirements beyond those of conventional non-programmable integrated circuits are needed due to the programmable nature of the CSL. For example, the arrangements of designed circuits on the CSL must facilitate implementation of useful functions by CAD software. This facilitation is typically accomplished by providing a wide selection of functional blocks and routing resources and providing a programmable means to connect both blocks and routing. Unfortunately, more flexible programmability of the CSL causes more complex CSL production testing procedures.

In production testing, the CSL must be programmed a large number of times in differing configurations to exhaust the combinations of possible interconnections of built-in circuits. As the flexibility of programming the CSL increases, the number of possible combinations of interconnections of built-in circuits increases. The cost of production of the CSL increases with the increase in complexity of CSL testing procedures.

During programming of the configuration memory elements, the internal logic of the CSL is unstable and unpredictable. The internal signals from this logic may be provided to output buffers and be driven to off-chip components. Therefore, a CSL requires a means to generate predictable states in the programmable I/O circuitry (PIO) of the CSL. The PIO performs the I/O function of the CSL.

Conventionally, using a tri-state buffer in an IOB while connecting the output pad of the IOB to a "weak pull-up" circuit is adequate in most situations. A weak pull-up circuit connected to an output pad provides a connection to a logic one that can be easily overcome by a signal asserted on the output pad. For example, Xilinx Inc. provides a weak pull-up circuit and a tri-state buffer in their IOB shown on page 4–25 of the Xilinx Programmable Logic Data Book, Version 1.03 (Jul. 30, 1996). A conventional pull-up circuit as described above limits the flexibility of a system designer by limiting the options available for defining a given logic state on the output pad.

Some IOBs within conventional FPGAs allow input signals to pass directly into selected routing channels. However, the number of channels available for a direct connection to a input terminal providing input signals is seriously limited. Other IOBs have latched or registered input signals before routing the signals into other routing channels. However, this latching or registering significantly increases the circuit area as well as the delay involved in selecting signals for routing.

Conventional programmable logic architectures comprising homogeneous arrays of smaller tiles commonly utilize a unique design and layout at each edge of the tile array to control the I/O interfaces between the logic array and external signals. Although the function and connectivity of the tile at each edge may be individually customized to take particular advantage of the location of the tile, the expense of this customization is greatly increased effort for design, verification, and layout.

Therefore, a need arises for an improved IOB which increases the number of channels available for direct connection to an input terminal while reducing circuit area and routing delay. Further, a need arises for an I/O block tile that makes externals driven or received by the tile similarly available to internal tiles without regard to the edge location of the tile.

SUMMARY OF THE INVENTION

The I/O circuit of the present invention provides optimal flexibility and performance using a number of different structures and methods.

The present invention provides a combination control circuit for an input pad wherein the signal on the pad may be pulled up to a logic one, pulled down to a logic low, or pulled to the logic value present on the input pad.

The present invention uses a configuration signal to select a value for an enable signal to either disable an output buffer during configuration, or to enable the output buffer according to a programmed value of a memory element. If the output buffer is enabled during configuration, the driven value can be programmed by memory elements. If the output buffer is disabled during configuration, the output pad can be pulled up to a logic one or pulled down to a logic zero based on a logical function of programmed memory elements. Thus, the present invention guarantees predictable output characteristics when a configurable system logic device is being programmed.

The present invention further provides a delay circuit that programmably varies the amount of the delay through the circuit. Specifically, the present invention provides a signal propagation delay from a programmable input/output (PIO) to an internal routing structure. As a result, zero hold time for an arbitrary input register relative to a fixed global clock is achieved.

In accordance with another aspect of the present invention, an OR gate combines the inputs from a horizontal routing channel and a vertical routing channel and provides the combined signal to the data input of an output register. This use of the OR gate allows one test configuration during production testing to test two input signals into the register. In contrast, conventionally, two test configurations would be required to perform these two tests. Thus, the invention significantly reduces product test time in production of a CSoC.

In yet another aspect of the present invention, a transistor is coupled to two PIO input pads. As a result, the input pads may be coupled together by controlling the voltage at the gate of the transistor. This direct coupling allows fast signal transfer between the input pads.

The present invention also addresses flexible routing structures. In one embodiment, a bypass latch is used to enable system routing to receive both a current input signal (through a first channel) and the last value of the input signal (through a second channel). The latch may be disabled, thereby allowing the routing to receive the current input signal via both channels.

In a final aspect of the present invention, a plurality of identical input/output block tiles are provided, thereby ensuring that each interior logic tile coupled to an IOB tile receives the same signal set, regardless of the edge to which the IOB tile is coupled.

BRIEF DESCRIPTION OF THE DRAWINGS

FIG. 5A is a table describing a mode of operation of the PIO of FIG. 5;

FIG. 5B is a table describing another mode of operation of the PIO of FIG. 5;

DETAILED DESCRIPTION OF THE INVENTION

Figure 1:
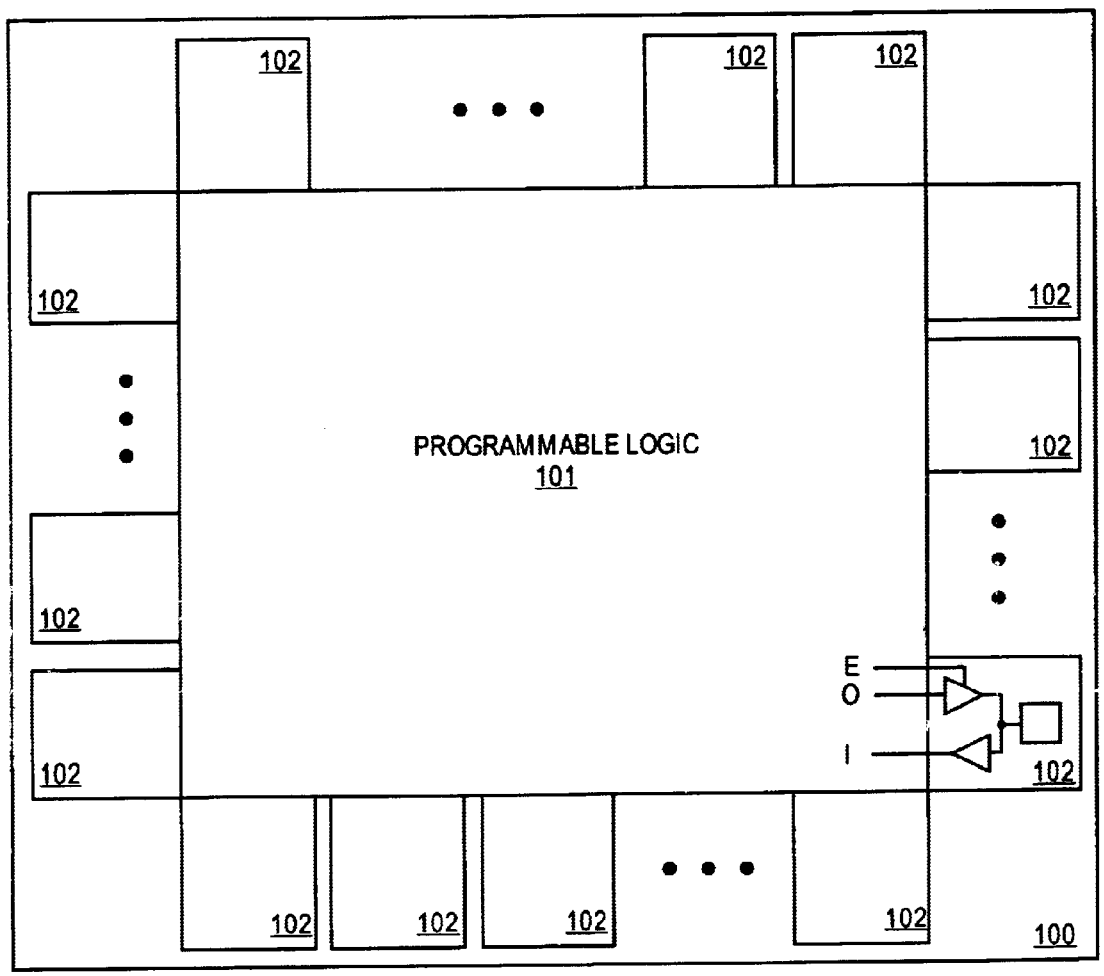
FIG. 1 is a block diagram of a conventional field programmable logic device.

FIG. 1 is a block diagram of a conventional field programmable logic device (FPLD) 101 including IOBs 102. IOBs 102 provide an interface with external circuitry.

Figure 2:
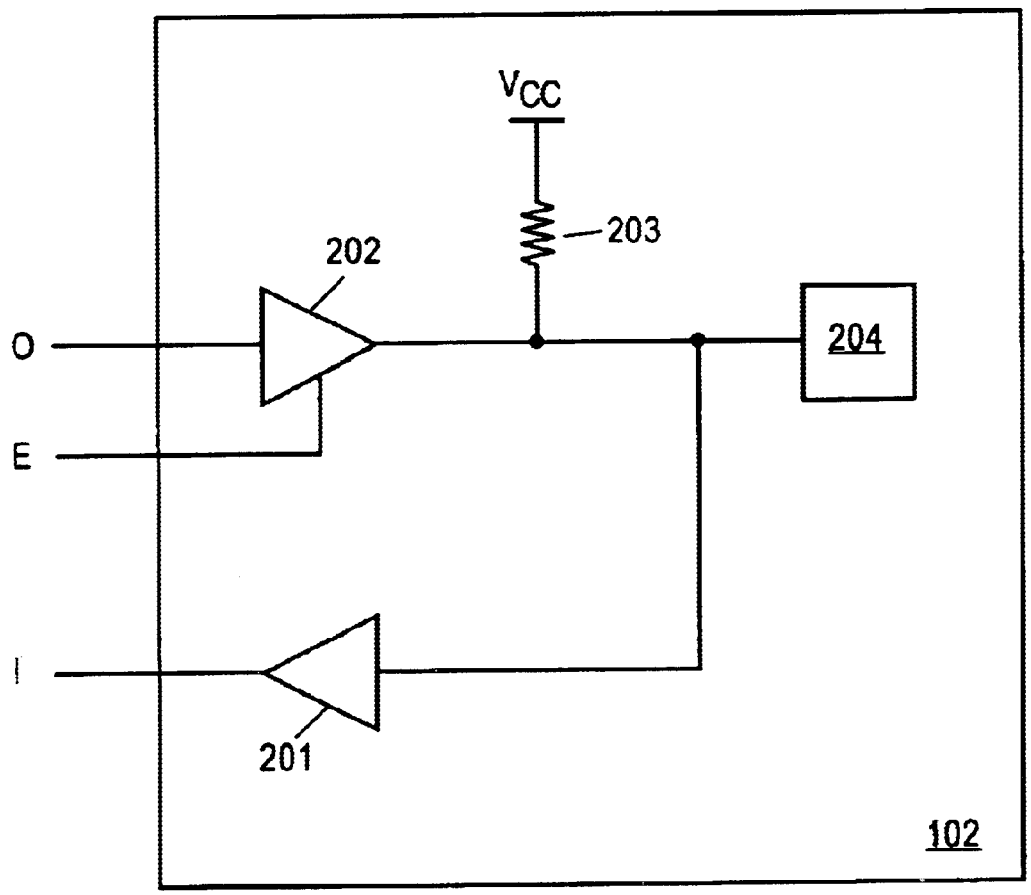
FIG. 2 is a schematic diagram of a conventional IOB for the field programmable logic device of FIG. 1.

FIG. 2 is a schematic diagram of a conventional circuit to implement one of IOBs 102 of FPLD 101. IOB 102 includes buffers 201–202, pull-up resistor 203, and I/O pad 204. This conventional pull-up circuit limits the flexibility of a system designer by limiting the options available for defining a given logic state on the output pad.

Figure 3:
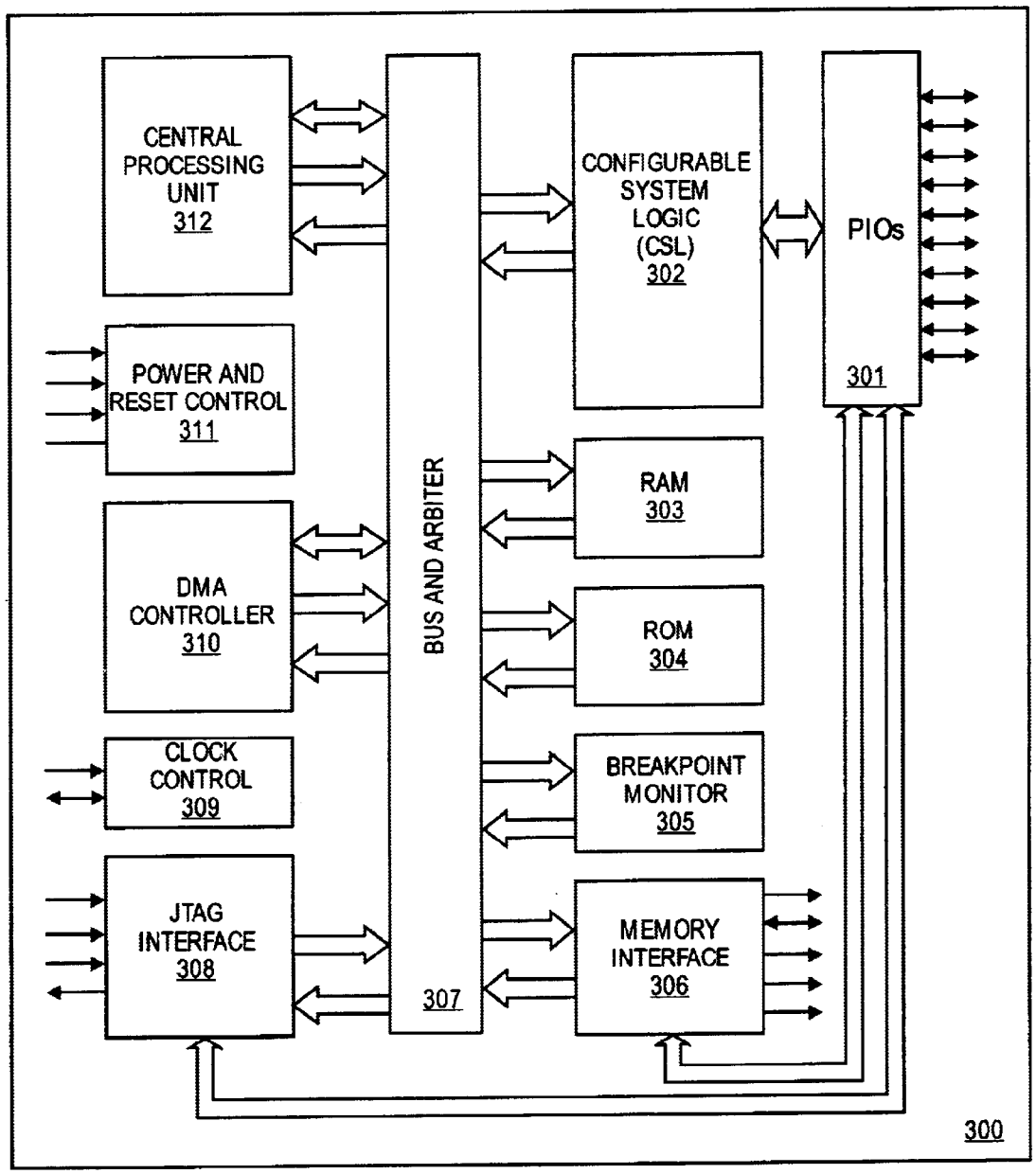
FIG. 3 is a schematic diagram of a configurable system on a chip in accordance with an embodiment of the present invention.

FIG. 3 is a schematic diagram of a Configurable System on a Chip (CSoC) in accordance with an embodiment of the present invention.

Figure 4:
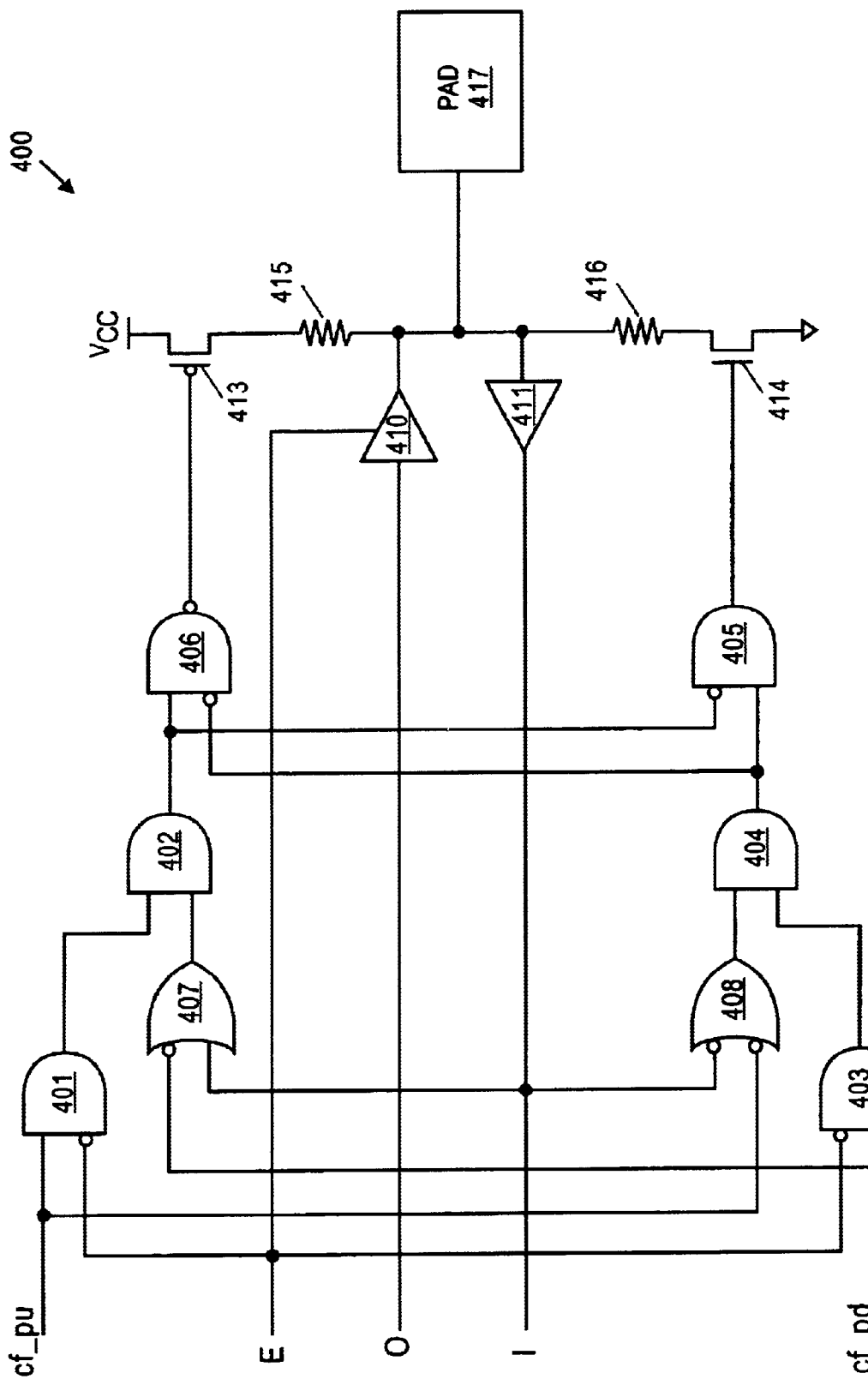
FIG. 4 is a schematic diagram of a PIO in accordance with an embodiment of the present invention.

FIG. 4 is a schematic diagram of CSL PIO 400 in accordance with an embodiment of the present invention. The I signal is the input data signal to the CSL from I/O pad 417. The O signal is the output data signal from the CSL to I/O pad 417. The E signal is the output enable signal for PIO 400. The cf_pu signal is the configuration pull-up signal and the cf_pd signal is the configuration pull-down signal.

PIO 400 is user-enabled to provide a static weak pull-up mode, a static weak pull-down mode, a weak signal follower mode, or none of the above. To operate PIO 400 in a static weak pull-up mode, configuration pull-up signal cf_pu is a logic one, configuration pull-down signal cf_pd is a logic zero, and output enable signal E is a logic zero. Note that the logic low output enable signal E tri-states output buffer 410, thereby preventing any transfer of output data signal O. Under these conditions, a logic zero is provided to the gate of n-channel transistor 414, thereby turning off that transistor, and a logic zero is provided to the gate of p-channel transistor 413, thereby turning on that transistor. Thus, in a static weak pull-up mode, I/O pad 417 is coupled to the voltage supply source $V_{cc}$ through resistor 415 (hence the "weak" pull-up).

To operate PIO 400 in a static weak pull-down mode, configuration pull-up signal cf_pu is a logic zero, configuration pull-down signal cf_pd is a logic one, and output enable signal E is a logic zero. Under these conditions, a logic one is provided to the gate of p-channel transistor 413, thereby turning off that transistor, and a logic one is provided to n-channel transistor 414, thereby turning on that transistor. Thus, in a static weak pull-down mode, I/O pad 417 is coupled to ground through resistor 416 (hence the "weak" pull-down).

To operate PIO 400 in a weak follower mode, the configuration pull-up cf_pu and configuration pull-down cf_pd signals are logic ones and the output enable signal E is a logic zero. Under these conditions, the logic value of the signal at pad 417 determines the state of transistor 413–415. For example, if the signal on I/O pad 417 is a logic zero, then the input data signal I is a logic zero, which turns on p-channel transistor 414 and turns off n-channel transistor 413. In this manner, PIO 400 will continues to pull the voltage on I/O pad 417 to a logic zero. In contrast, if the signal on I/O pad 417 is a logic one, then input data signal I is a logic one which turns off n-channel transistor 414 and turns on p-channel transistor 413. In this manner, PIO 400 continues to pull the voltage on I/O pad 417 to a logic one.

When the configuration pull-up cf_pu and configuration pull-down cf_pd signals are logic zeros, PIO 400 does not provide a pull-up or pull-down on I/O pad 417.

As described above, PIO 400 allows a user to programmably enable a signal follower on each input data signal present on I/O pad 417. Additionally, the signal follower of PIO 400 avoids the power use, signal noise, and time required to actively drive the data signal on I/O pad 417 to the level of a static weak pull-up or pull-down. Therefore, maintenance of the data signal on I/O pad 417 at the current state avoids many high current input conditions.

Programmable CSL PIO 400 offers improved control over the interactions on CSOC 300. For example, if I/O pad 417 provided an active high select signal to an external chip on a board, then programming CSL PIO 400 to drive I/O pad 417 low in the absence of a select signal prevents spurious selection of that external chip.

Figure 5:
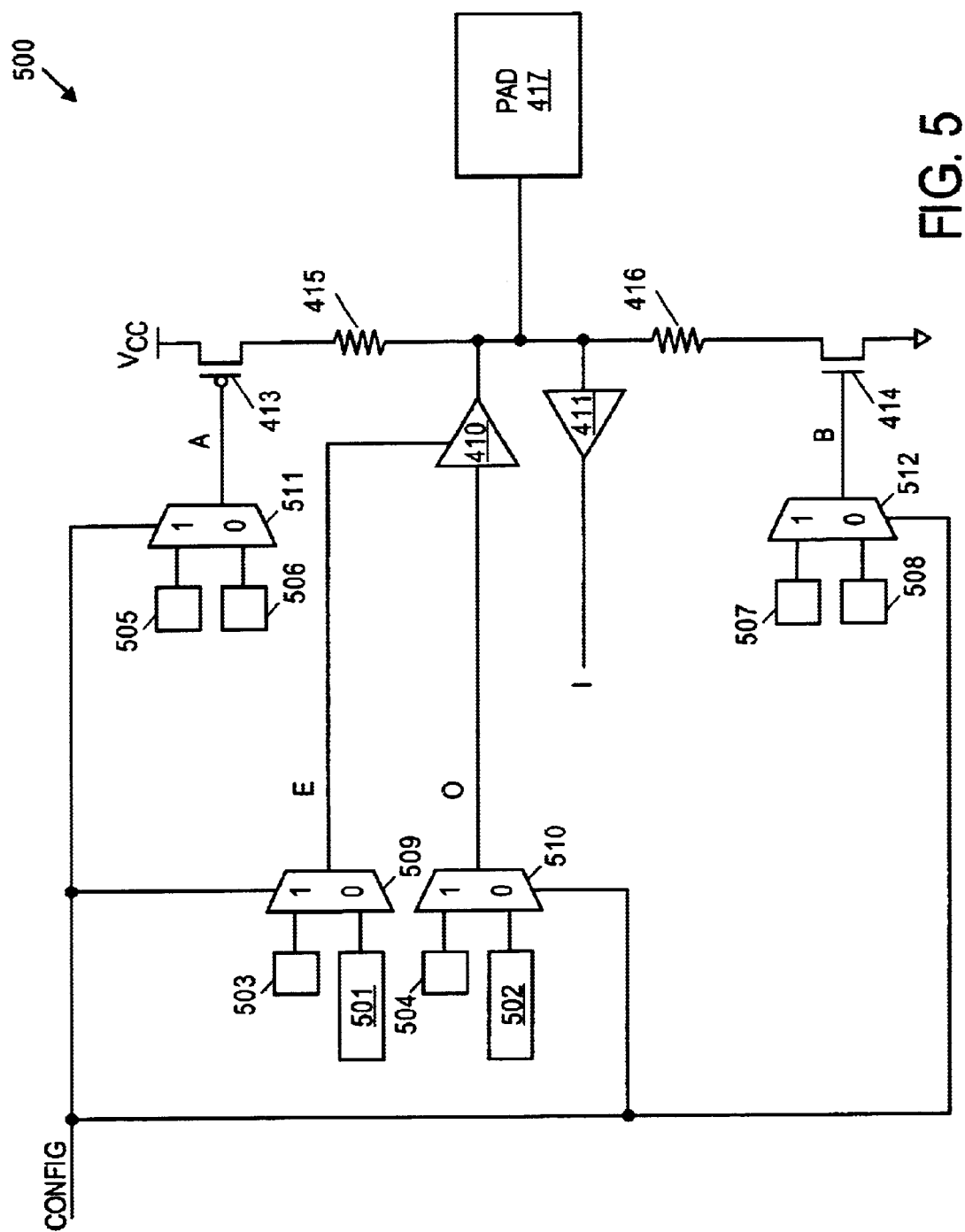
FIG. 5 is a schematic diagram of another PIO in accordance with another embodiment of the present invention.

FIG. 5 is a schematic diagram of CSL PIO 500 in accordance with another embodiment of the present invention. Similar elements between PIOs in FIGS. 4 and 5 are labeled similarly. PIO 500 includes buffers 410–411, p-channel transistor 413, n-channel transistor 414, resistors 415–416, I/O pad 417, user output enable logic 501, user output data logic 502, memory cells 503–508 and multiplexers 509–512. The configuration signal CONFIG is a logic one when the CSL is being configured and a logic zero when the CSL is in normal operation.

PIO 500 also provides the user with the ability to enable a static weak pull-up mode, a static weak pull-down mode, or none of the above, as described above with respect to FIG. 4. However, PIO 500 does not provide a weak follower mode. PIO 500 additionally provides the user with the ability to define the output enable signal E and the output data signal 0 as well as the ability to inject an actively driven signal onto I/O pad 417 during reconfiguration of the CSL. The operation of PIO 500 is defined by the tables of FIGS. 5A and 5B.

FIG. 5A describes the normal operation of PIO 500 when the configuration signal CONFIG is a logic zero. Note that the software is set to disallow the state of memory cell 506 storing a logic zero and memory cell 508 storing a logic one. This logic zero of the configuration signal CONFIG passes a user-defined signal from user output enable logic 501 as the output enable signal E of multiplexer 509. Additionally, the logic zero of the configuration signal CONFIG passes a user-defined signal from user output data logic 502 as the output data signal 0 of multiplexer 510.

The signal value at node A controls p-channel transistor 413. During normal operation of the CSL, the logic zero of the configuration signal CONFIG causes multiplexer 511 to pass the value programmed in memory cell 506 as an output signal at node A. The signal value at node B controls n-channel transistor 414. During normal operation of the CSL, the logic zero of the configuration signal CONFIG causes multiplexer 512 to pass the value programmed in memory cell 508 as an output signal at node B.

Logic zeros stored in memory cells 506 and 508 turn on p-channel transistor 413 and turn off n-channel transistor 414. As a result, PIO 500 acts as a static weak pull-up circuit when user output enable logic 501 is a logic zero. However, PIO 500 drives I/O pad 417 to the value of user output data logic 502 when user output enable logic 501 is a logic one while still providing a weak pull-up.

A logic one stored in memory cell 506 turns off p-channel transistor 413 and a logic zero stored in memory cell 508 turns off n-channel transistor 414. As a result, there is no mode active when user output enable logic 501 is a logic zero. However, PIO 500 drives I/O pad 417 to the value of user output data logic 502 when user output enable logic 501 is a logic one.

A logic one stored in memory cell 506 turns off p-channel transistor 413 and a logic one stored in memory cell 508 turns on n-channel transistor 414. As a result, PIO 500 acts as a weak pull-down when user output enable logic 501 is a logic zero. However, PIO 500 drives I/O pad 417 to the value of user output data logic 502 when user output enable logic 501 is a logic one while still providing a weak pull-down.

FIG. 5B describes the configuration of PIO 500 when the configuration signal CONFIG is a logic one. Note that the software is set to disallow the state of memory cell 506 storing a logic zero and memory cell 508 storing a logic one. Additionally, the software is set to disallow memory cells 505 and 507 from having the same value when the user output enable logic 501 is a logic one.

The logic one configuration signal CONFIG passes the value stored in memory cell 503 as the output enable signal E of multiplexer 509 and the value stored in memory cell 504 as the output data signal 0 of multiplexer 510.

The signal value at node A controls p-channel transistor 413. During configuration of the CSL, the logic one configuration signal CONFIG causes multiplexer 511 to pass the value programmed in memory cell 505 as an output signal at node A. The signal value at node B controls n-channel transistor 414. During configuration of the CSL, the logic one configuration signal CONFIG causes multiplexer 512 to pass the value programmed in memory cell 507 as an output signal at node B.

A logic zero stored in memory cell 505 turns on p-channel transistor 413 and a logic zero of memory cell 507 turns off n-channel transistor 414. As a result, PIO 500 acts as a static weak pull-up circuit when user output enable logic 501 is a logic zero.

A logic one stored in memory cell 505 turns off p-channel transistor 413 and a logic zero stored in memory cell 507 turns off n-channel transistor 414. As a result, there is no mode active when user output enable logic 501 is a logic zero. However, PIO 500 drives I/O pad 417 strongly to the value stored in memory cell 504 when user output enable logic 501 is a logic one. A logic one stored in memory cell 505 turns off p-channel transistor 413 and a logic one stored in memory cell 507 turns on n-channel transistor 414. As a result, PIO 500 acts as a weak pull-down when user output enable logic 501 is a logic zero.

On power up of the CSOC, memory cells 503, 505 and 507 all store logic zeros to guarantee that I/O pad 417 is tristated and that a weak pull-up mode is active. This configuration beneficially allows modification early in the configuration sequence. On subsequent re-configuration, the voltage in I/O pad 417 is determined by the truth table of FIG. 5B. Note that during initial configuration, other chips on a board are often reset. However, during reconfiguration, other chips on the board are often actively running.

Figure 6:
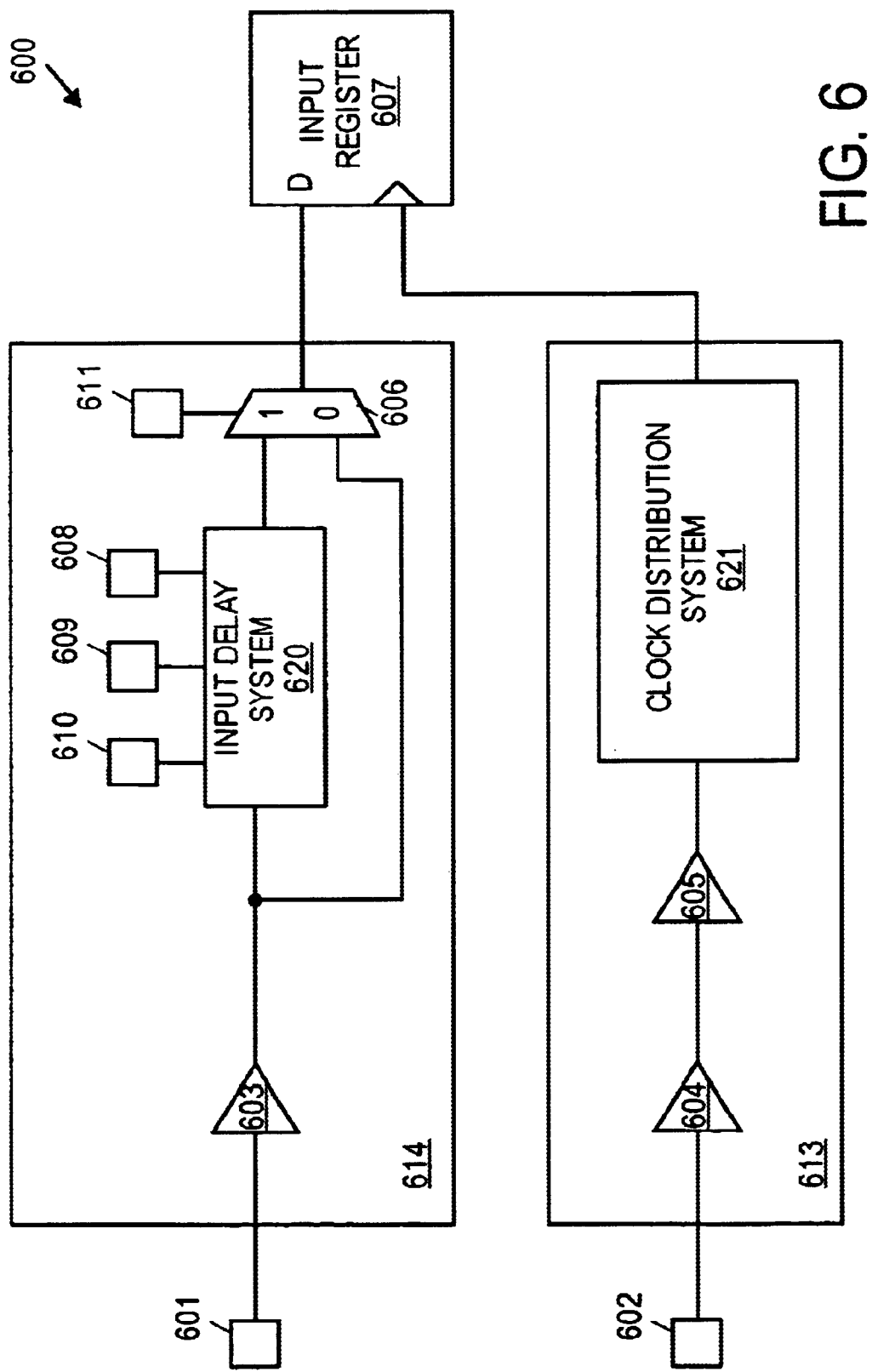
FIG. 6 is a schematic diagram of a programmable delay circuit in accordance with an embodiment of the present invention.

FIG. 6 is a schematic diagram of a programmable delay circuit 600 in accordance with an embodiment of the present invention. Programmable delay circuit 600 includes input pads 601–602, clock path 613, data path 614 and input register 607. Clock path 613 includes buffers 604–605 and clock distribution system 621. Data path 614 includes buffer 603, multiplexer 606, memory cells 608–611, and input delay system 620. Input register 607 has a data input terminal and a clock input terminal. Other embodiments may have other numbers of memory cells.

Input pad 601 provides the Data_In signal to the data input terminal of input register 607 via data path 614. Input pad 602 provides the Global_Clock_In signal to the clock input terminal of input register 607 via clock path 613.

Clock distribution system 621 contains an inherent delay due to routing and buffering. For example, this delay may come from a clock tree distribution of the Global_Clock_In signal. This inherent delay means data present at the data input terminal of input register 607 must "wait" for the clock signal to arrive. Thus, the data present at the data input terminal can not be clocked into input register 607 until the delayed clock signal arrives at the clock input terminal. This amount of time that data has to wait is called the "hold time" of the circuit.

The hold time of the circuit can be minimized by adding delay to data path 614 of the circuit. If an amount of delay equivalent to the amount of delay in clock distribution system 621 can be added to data path 614, the hold time of the circuit can be lessened to substantially zero. Thus, a circuit has "zero hold time" when the delay in data path 614 equals the delay in clock path 613. When a circuit has zero hold time, the data signal does not need to wait at the data input terminal. Therefore, the data signal may change at substantially the same time as the clock signal.

Multiplexer 606 provides the user with the option to use the Data_In signal or the delayed Data_In signal, based on the value stored in memory cell 611. Input delay system 620 uses the values stored in memory cells 608–611 to select one of eight different delay paths. Thus, the user is able to select the amount of delay in programmable delay circuit 600. This programmability of the data path delay is especially time-saving in situations where the manufacturing process is not well-characterized and the clock distribution delay is not well known. In the present invention, the user only has to design the range of delays available in input delay system 620 to cover any possible delay in clock path 613. Input delay system 620 is shown in greater detail in FIG. 7.

Another use for the programmability of input delay system 620 is to allow the user to tailor the data delay after the place and route of the design is finished. At that point, the clock delay of clock path 613 may be characterized to optimize system performance.

Figure 7:
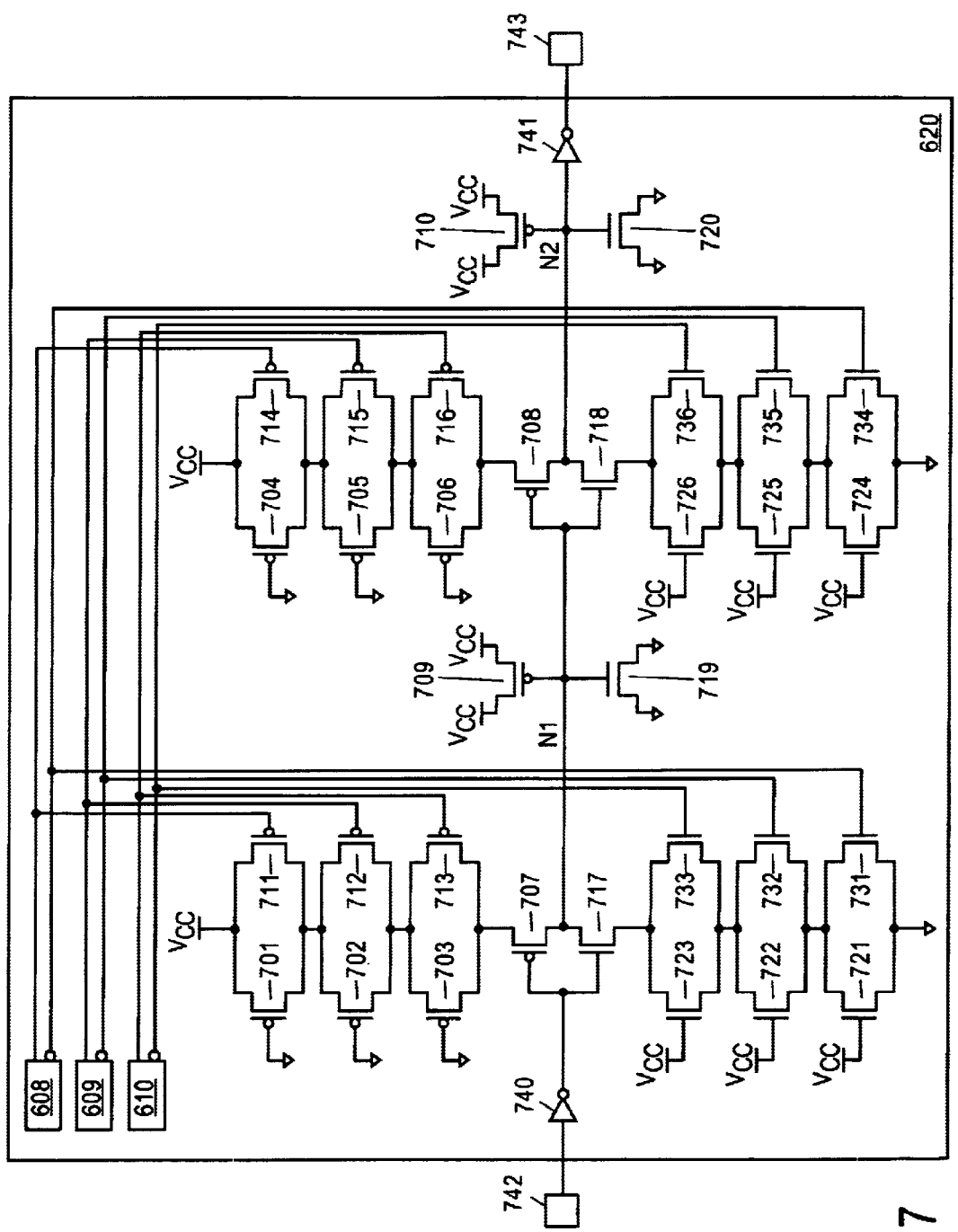
FIG. 7 is another embodiment of the input delay circuit of FIG. 6.

FIG. 7 describes one embodiment of the input delay system 620 of programmable delay circuit 600 (FIG. 6). Input delay system 620 includes p-channel transistors 701–716, n-channel transistors 717–726 and 731–736, and inverters 740–741. Data is provided to input delay system 620 at an input 742. Data is provided to the external system from input delay system 620 at an output 743.

Memory cells 608–610 are used to select one of eight possible combinations of transistor pairs. These combinations of transistor pairs provide a resistive path to charge and discharge the MOS capacitors formed by transistors 709–710 and 719–720. For example, when memory cells 608–610 each store the logic value "0", p-channel transistors 711–716 (receiving logic zeros) and n-channel transistors 731–736 (receiving logic ones) are all on. As a result, the effective resistance provided by transistors is at the smallest value. Transistors 707–708 and 717–718 are sized so that their effective resistance is changed by turning on or off a series of different sized transistors.

P-channel transistors 701–703 are fabricated such that they have resistance values in the proportion R, 2R, and 4R, respectively. Therefore, p-channel transistor 703 has twice the resistance value of p-channel transistor 702, and p-channel transistor 702 has twice the resistance value of p-channel transistor 701. Similarly, p-channel transistors 704-706 and n-channel transistors 721-723 and 724–726 have resistance values in the proportion R, 2R, and 4R, respectively. P-channel transistors 711–716 and n-channel transistors 731–736 are fabricated to have resistance values much less than R. Of course, other embodiments of the present invention may have other proportions of resistance values.

P-channel transistors 701–703 and 711–713 are coupled to form a first series resistor circuit between the voltage supply source $V_{cc}$ and the source of p-channel transistor 707. N-channel transistors 721–723 and 731–733 are coupled to form a second series resistor circuit between the drain of n-channel transistor 717 and ground. P-channel transistor 707 and n-channel transistor 717 are coupled to form a first inverter with an input terminal coupled to the output of inverter 740 and an output terminal at node N1. This first inverter serves to couple node N1 to either the voltage supply source $V_{cc}$ through the first series resistor circuit or ground through the second series resistor circuit. A logic zero on the input terminal of the first inverter couples the first series resistor circuit to node N1, thereby providing a current source to node N1. A logic one on the input terminal of the first inverter couples the second series resistor circuit to node N1, thereby providing a current sink from node N1.

The logic values stored within memory cells 608–610 are coupled to the gates of p-channel transistors 711–713. When memory cells 608–610 all store logic values logic one, each of p-channel transistors 711–713 is turned off. As a result, the resistance values of p-channel transistors 701–703 form the resistance of the first series resistor circuit. Therefore, the resistance of the first series resistor circuit formed by p-channel transistors 701–703 and 711–713 has a maximum resistance value of 7R. Similarly, these logic values of memory cells 608–610 turn off each of n-channel transistors 731–733. As a result, the resistance values of n-channel transistors 721–723 form the resistance of the second series resistor circuit. Therefore, the resistance of the second series resistor circuit formed by n-channel transistors 721–723 and 731–733 has a maximum resistance value of 7R.

In this situation, where memory cells 608–610 all store a logic one, both the first and the second series resistor circuits have resistance values of 7R. Therefore, a relatively small current will flow either from the first series resistor circuit to node N1 or from node N1 to the second series resistor circuit.

P-channel transistor 709 has both a source and a drain coupled to voltage supply source $V_{cc}$. N-channel transistor 719 has both a source and a drain coupled to ground. P-channel transistor 709 and n-channel transistor 719 each have a gate coupled to node N1, thereby forming two capacitors.

When the data signal at input 742 is a logic zero, the voltage at node N1 is pulled down to a logic zero through the second series resistor circuit formed by n-channel transistors 721–723. This logic zero at node N1 turns on p-channel transistor 709 and turns off n-channel transistor 719.

When the data signal at input 742 transitions to a logic one, the output voltage of the first inverter formed by p-channel transistor 707 and n-channel transistor 717 transitions from a logic zero to a logic one. When the voltage at node N1 reaches a voltage equal to one threshold voltage, n-channel transistor 719 turns on lightly. At this time, a gate capacitance appears at node N1. This gate capacitance causes the relatively small current to take a long time to charge up node N1 to a logic one, thereby delaying the input signal at input 742.

P-channel transistors 704–706 and 714–716 form a third series resistor circuit similar to the first series resistor circuit. N-channel transistors 724–726 and 734–736 form a series resistor circuit similar to the second series resistor circuit. P-channel transistor 710 and n-channel transistor 720 form a capacitor pair similar to p-channel transistor 709 and n-channel transistor 719. Therefore, in a similar fashion to that described above, the input signal at input 742 is further delayed through input delay system 620. The series resistor circuits in combination with capacitors 709–710 and 719–720 form a series of two resistor-capacitor (RC) segments.

When memory cells 608 and 610 both store logic zeros and memory cell 609 stores a logic one, p-channel transistors 711 and 713 are turned on, while p-channel transistor 712 is turned off. P-channel transistors 711 and 713 short transistors 701 and 703, respectively, thereby lessening the resistance value of the first series resistor circuit to 2R. Similarly, N-channel transistors 731 and 733 short n-channel transistors 721 and 723, respectively, thereby lessening the resistance value of the second series resistor circuit to 2R. As a result, the current flowing through node N1 is greater under these circumstances than the relatively small current flowing through node N1 when memory cells 608–610 all stored logic ones.

The effect of this larger current flowing through node N1 is to take less time to charge the capacitors formed by p-channel transistor 709 and n-channel transistor 719. Similarly, the larger current flowing through node N2 allows the capacitors formed by p-channel transistor 710 and n-channel transistor 720 to charge more quickly. As a result, the delay in passing the data value from input 742 through input delay system 620 is much shorter than described above.

When memory cells 608–610 all store logic ones, they provide a large resistance in a series resistor circuit. This large resistance results in a small current. The small current takes a relatively long time to charge capacitors, thereby causing a relatively long delay within input delay system 620. When memory cells 608–610 all store logic zeros, they provide a small resistance in a series resistor circuit. This small resistance results in a large current. The large current takes a relatively short time to charge capacitors, thereby causing a relatively short delay within input delay system 620. In this manner, the delay within input delay system 620 is programmable by the user.

Inverters 740–741 are used to buffer the data input and data output of delay circuit element 620, allowing this circuit to stand alone.

Figure 8A:
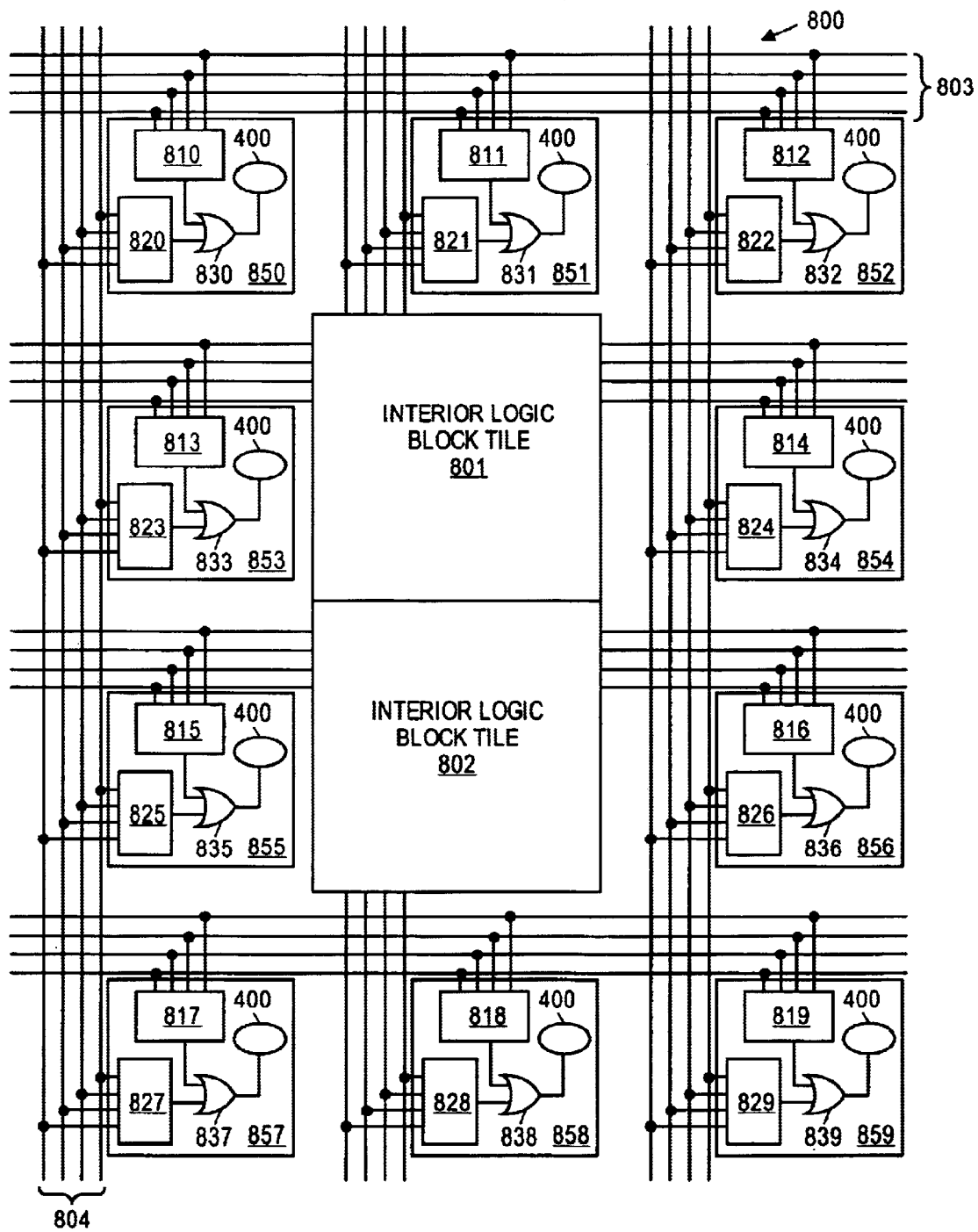
FIG. 8A is a schematic diagram of placement-independent edge tiles in a semi-homogeneous logic array in accordance with an embodiment of the present invention.

FIG. 8A is a schematic diagram of placement-independent edge tiles in a semi-homogeneous logic array in accordance with an embodiment of the present invention.

Array of tiles 800 is part of a homogeneous array of larger tiles forming a programmable logic architecture. Array of tiles 800 comprises interior logic block tiles 801–802 and identical edge-placed I/O tiles 850–859. Identical edge-placed I/O tiles 850–859 are designed such that the external signals they receive are similarly or identically available to interior logic block tiles 801–802 without regard to the edge at which I/O tiles 850–859 are placed.

I/O tile 850 includes vertical input multiplexer 810, horizontal input multiplexer 820, OR gate 830 and internal circuitry 840. Identical I/O tiles 851–859 include vertical input multiplexers 811–819, horizontal input multiplexers 821–829, OR gates 831–839, and internal circuitry 841–849, respectively.

I/O tiles 850–859 are designed to have the same physical dimensions as the tiles to which they abut. All general CSL interconnect and power routing along the edge of I/O tiles 850–859 must conform with the dimensions of abutting tiles on all sides. Routing channels which carry signals not generated within, nor needed to pass through, array of tiles 800 may be used to convey external I/O signals. This connectivity may be defined by simple metal-layer programming during layout.

The number of input multiplexers (e.g., 810 and 820) which bring general CSL interconnect lines into the internal circuits of the I/O tile is doubled from conventional methods. Conventional IOBs use a single multiplexer coupled to receive twice the number of input signals of input multiplexer 810. This single multiplexer is expensive in terms of time required to test the I/O tile during production. The use of two multiplexers each receiving half the number of signal of the conventional multiplexer halves the number of test configurations required during production. Note that it is not necessary to double the number of, for example, horizontal-channel input multiplexers to guarantee that a horizontally run signal is available to the same input in an I/O tile regardless of the placement of the tile. Each horizontal-channel input multiplexer output is ORed with a vertical channel input multiplexer output. Efficiency may be additionally increased by using fewer input multiplexers if the input signals are swappable.

Particular benefits of the I/O tiles 850–859 of the present invention include the ability to logically reside along any external edge due to the ORing of horizontal and vertical input multiplexer inputs. Additionally, ensuring identical dimensions and routing allows I/O tiles 850–859 to physically reside along any external edge. Furthermore, the I/O tiles 850–859 may be coupled with additional tiles because of their physical similarity to interior logic block tiles. Lastly, layout and design verification is greatly simplified with the present I/O tiles 850–859.

Figure 8B:
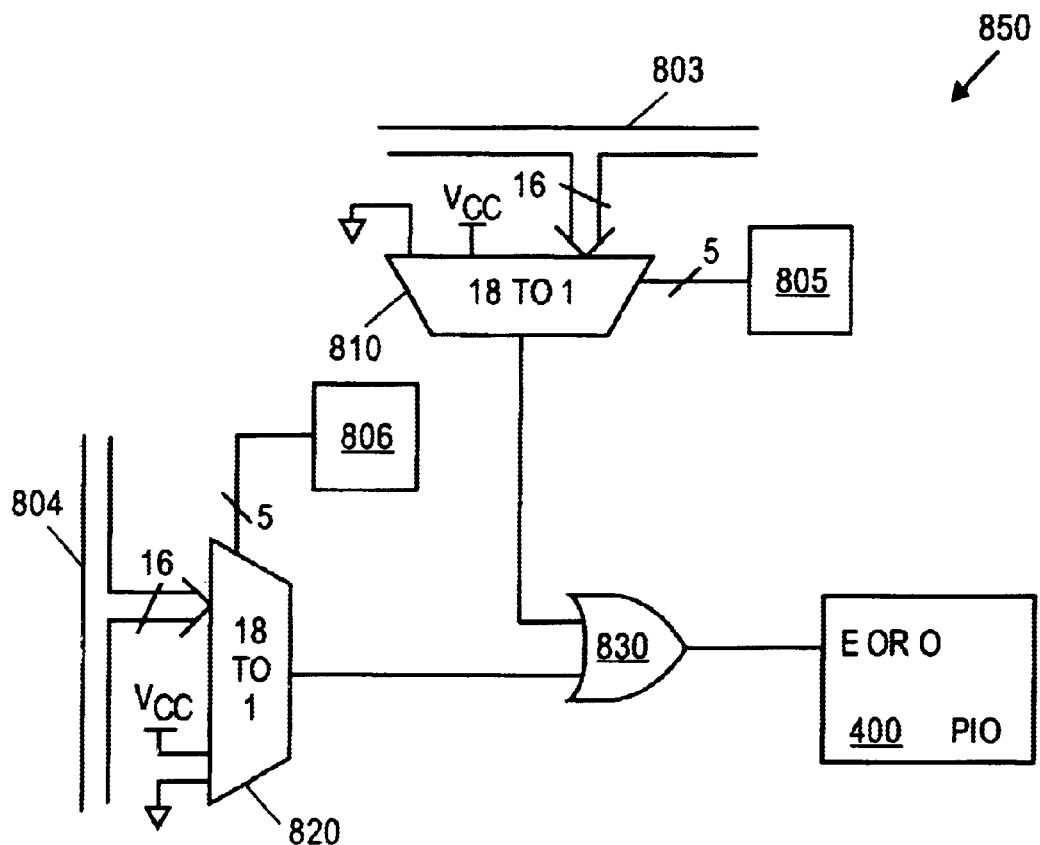
FIG. 8B is a detailed schematic diagram of an edge tile 850 of FIG. 8A showing the multiplexers at the O and E terminals of PIO 400 (FIG. 4)

FIG. 8b is a detailed schematic diagram of an identical edge-placed I/O tile 850 having input multiplexers which provide the value of the output data O and the output enable E signals to PIO 400 (FIG. 4).

Input multiplexer 820 receives a logic zero at an first input terminal, a logic one at a second input terminal, and sixteen (16) signals 804 from vertical routing channel at sixteen other input terminals. Input multiplexer 820 receives control signals from a plurality of memory cells 806. A vertical routing channel is a routing channel within the general CSL interconnect. Input multiplexer 810 receives a logic zero at an first input terminal, a logic one at a second input terminal, and sixteen (16) signals from horizontal routing channel 803 at sixteen other input terminals. Input multiplexer 810 receives control signals from a plurality of memory cells 805. A horizontal routing channel is a routing channel within the general CSL interconnect. Output data signal O to PIO 400 is the logical OR of the output signal of input multiplexers 820 and 810. Similarly, the output enable signal E to PIO 400 is the logical OR of the output signal of input multiplexers 820 and 810. By having the option to select signals from both horizontal routing channel 803 and vertical routing channel 804, multiple PIOs similar to PIO 400 can be used in different locations. Therefore, the same PIO design layout can be used on all four edges of the chip containing the CSL.

The use of the input multiplexers providing output data O and output enable E signals to PIO 400 provide enhanced testability for PIO 400. Specifically, the use of OR gate 830 allows one horizontal signal of horizontal routing channel 803 and one vertical signal of vertical routing channel 804 to be tested in the same test configuration. As a result, the single test configuration can test both horizontal and vertical connections by alternately forcing the vertical and the horizontal signals to a logic zero. Signals are forced to zero by routing a signal from one of the tester controllable resources (not shown) to the applicable input multiplexer. Therefore, to test all thirty-six configurations (signals from both horizontal routing channel 803 and vertical routing channel 804), only 18 test configurations are needed. Note that conventional implementation requires the use of one thirty-six by 1 input multiplexer to implement the same test configuration. Therefore, a conventional test of these 36 signals requires thirty-six test configurations, which is double the number required by the present invention.

Figure 9:
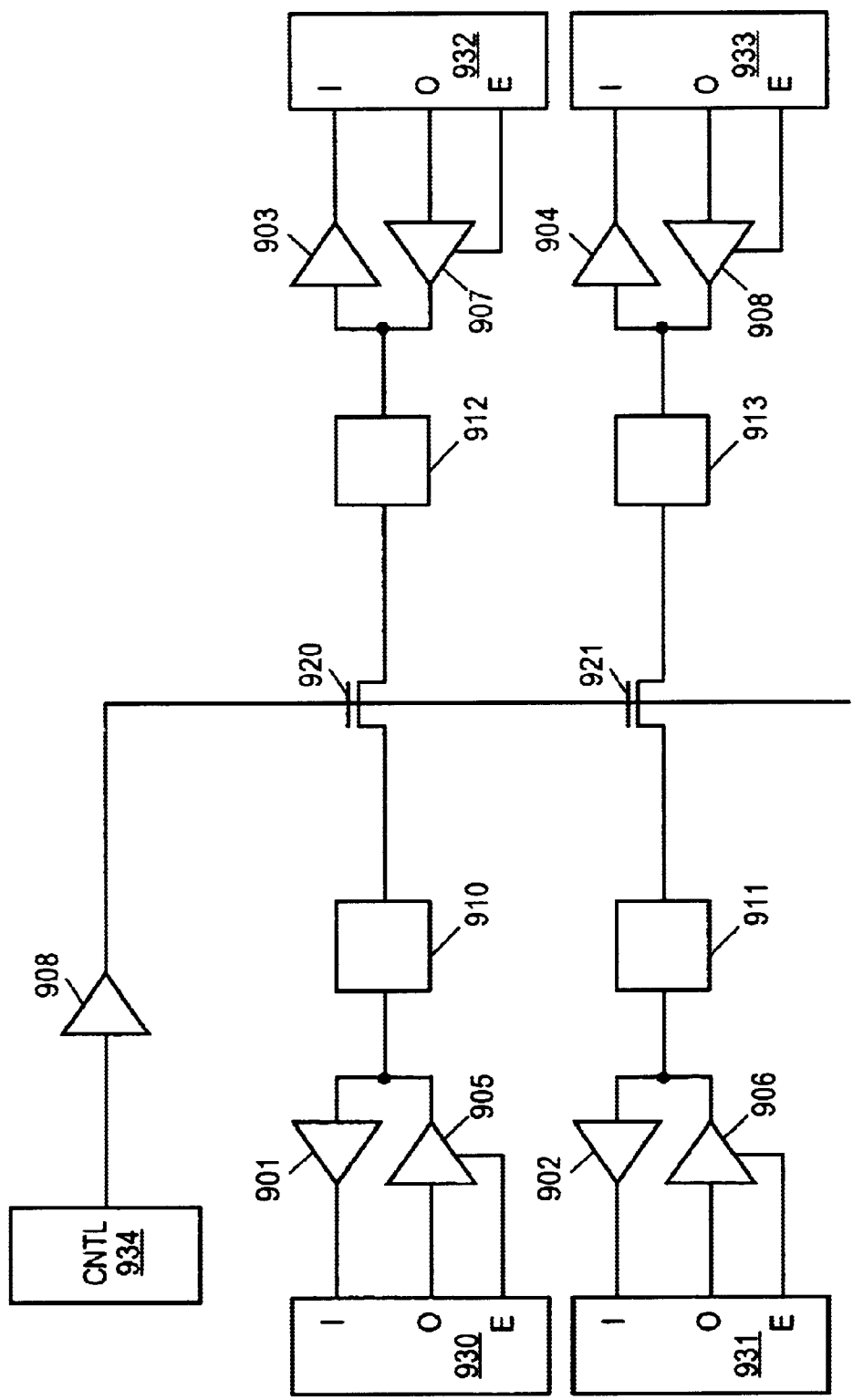
FIG. 9, is a schematic diagram of fast switches in accordance with an embodiment of the present invention.

FIG. 9 is a schematic diagram of fast switches in accordance with an embodiment of the present invention.

N-channel transistor switches 920–921 are coupled between pairs of I/O pads. I/O pad 910 is conventionally coupled to provide an input data I signal to user logic 930, and to receive an output data signal O through buffer 905, if enabled by output enable signal E. Similarly, I/O pads 911–913 are conventionally coupled to provide an input data I signal to user logic 931–933, respectively, and receive an output data signal O through buffers 906–908, respectively, if enabled by the output enable signal E.

User logic 934 provides a control signal to buffer 908. N-channel transistor switches 920–921 each have a gate coupled to the output signal of buffer 908. Therefore, a logic one asserted by user logic 934 turns on n-channel transistor switches 920–921. Turned on transistor switch 920 couples I/O pad 910 to I/O pad 912. As a result, the signal from I/O pad 912 can be transferred to I/O pad 910 without having to drive the input data I signal from user logic 932 through routing to the output data O signal of user logic 930. Therefore, I/O pads 910 and 912 are connected together with minimal propagation delay. Turned on transistor switch 921 couples I/O pad 913 to I/O pad 911 in a similar manner.

Switches 920–921 can be implemented in CMOS transmission gates. Alternatively, switches 920–921 can be implemented in NMOS pass transistors if the threshold drop while passing a logic one can be tolerated. Switches 920–921 can also be implemented in NMOS pass transistors having gates boosted by any of various conventional circuit techniques.

Figure 10:
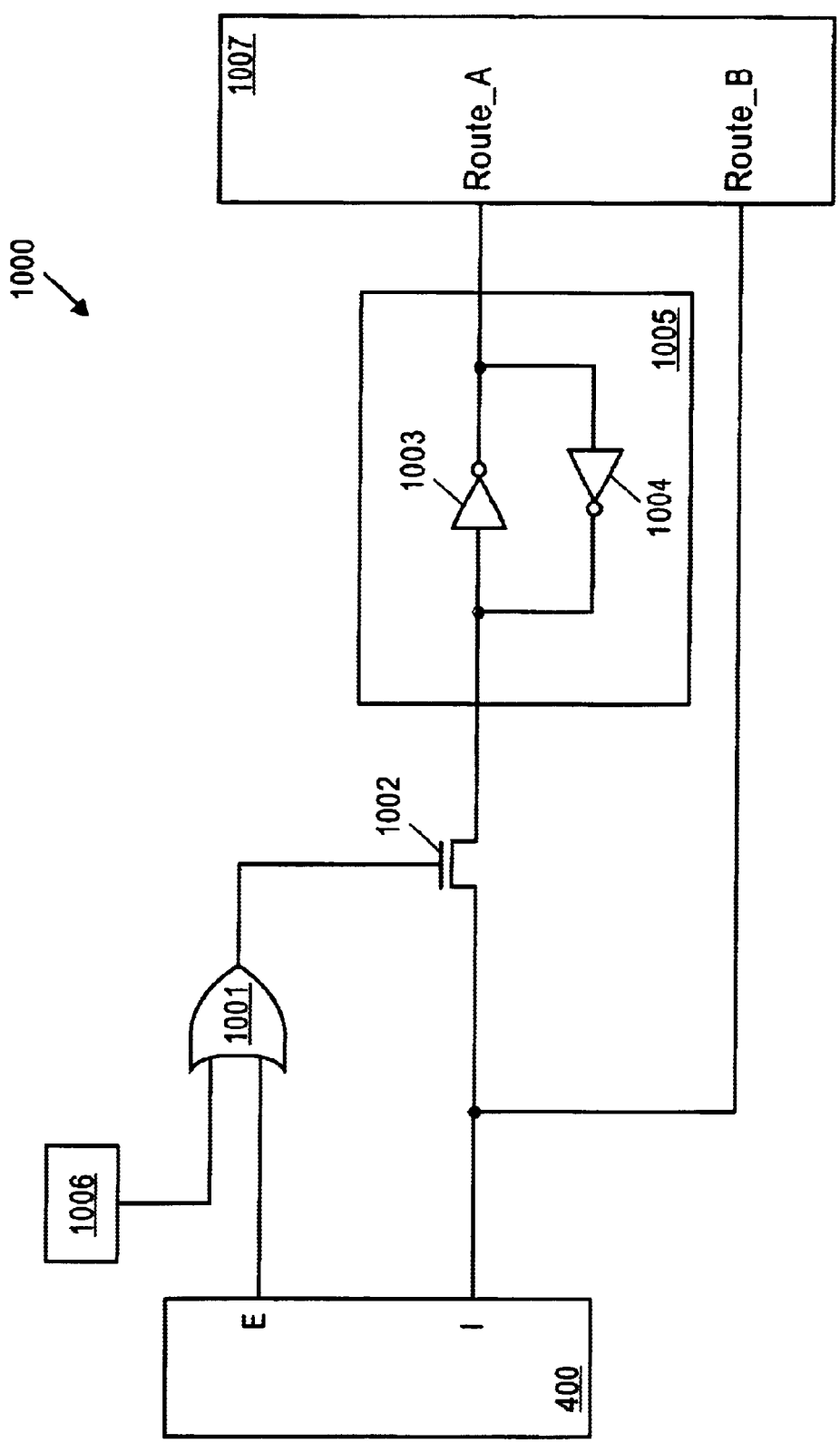
FIG. 10 is a schematic diagram of a latch bypass in accordance with an embodiment of the present invention.

FIG. 10 is a schematic diagram of a latch bypass 1000 in accordance with an embodiment of the present invention.

Latch bypass 1000 includes OR gate 1001, transistor 1002 and latch 1005. Latch 1005 includes inverters 1003–1004. A first route within routing 1007, Route_A, receives the data input signal through latch 1005. Routing 1007 is part of the general CSL interconnect of the CSOC. A second route within routing 1007, Route_B, receives the data input signal directly.

An input data signal I is provided by PIO 400 (FIG. 4) to the source of transistor 1002. As noted above, this input data signal I is also provided by PIO 400 directly to Route_B within routing 1007. The bypass signal provided by memory cell 1006 to the first input terminal of OR gate 1001 is generated by a programmable memory element in the CSL. A logic one bypass signal forces latch bypass 1000 into bypass mode. When latch bypass 1000 is in bypass mode, the current value of the input data signal I is available to routing 1007 via Route_A.

When latch bypass 1000 is in bypass mode, the output signal provided to Route_A is allowed to directly follow the input data signal I. A logic one output enable signal E or a logic one bypass signal from PIO 400 turns on transistor 1002. As a result, the input data signal I is coupled to the input node of latch 1005 through turned on transistor 1002. Therefore, both Route_A and Route_B within routing 1007 receive the current logic value of the input data signal, I.

When both the output enable signal E and the bypass signal are logic zeros, transistor 1002 is turned off. Under these circumstances, storage latch 1005 latches the value of the input data signal I. Therefore, Route_A within routing 1007 receives the latched logic value of the input data signal, I. Thus, the state of the input data signal I is preserved. If the input data signal I changes state, the current value of the input data signal I is available to routing 1007 through Route_B and the latched value of the input data signal is available to routing 1007 through Route_B.

The bypass signal may be permanently enabled, so that the input data signal I is always available to both Route_A and Route_B of routing 1007. As a result, the number of channels available for a direct connection to the input data signal I is increased. The availability latch bypass 1000 to provide both the current and previous input data signal I to the general CSL interconnect 1007 supplants the need for a multiplexer to receive both current and previous input data signals. Therefore, this implementation of latch bypass 1000 requires fewer multiplexers on the CSoC, thereby decreasing circuit area and decreasing additional delay involved in signal selection.

Although the present invention has been described in connection with one embodiment, it is understood that this invention is not limited to such embodiment, but is capable of various modifications which would be apparent to a person skilled in the art. Thus, the invention is limited only by the following claims.

We claim:

1. A method for an input/output circuit comprising:
   tri-stating an output buffer; and
   providing one of a weak pull-up, a weak pull-down, and a pad signal follower on an input pad of the input/output circuit wherein the input/output circuit is part of an integrated circuit of a configurable system on a chip.

2. The method of claim 1, wherein the weak pull-up to maintain a voltage level of the input pad is based upon a source driver internal to the input/output circuit controlling a conductive state of a pull-up device.

3. The method of claim 1, wherein the input pad couples through a plurality of logic gates to the weak pull-up and the weak pull-down.

4. A method, comprising:
   maintaining a voltage level of an input pad of an input/output circuit in a configurable system on a chip in a stable state based upon a source driver internal to the input/output circuit controlling a conductive state of a pull-up device and a pull-down device, wherein the voltage level of the input pad represents a first logic state; and coupling a voltage level of an input signal through a plurality of logic gates to the pull-up device and the pull-down device; and changing the voltage level of the input pad to a second logic state based upon the voltage level of the input signal controlling the conductive state of the pull-up device and the pull-down device by overcoming biasing by the source driver.

* * * * *